United States Patent
Ziglioli

(10) Patent No.: US 9,096,421 B2
(45) Date of Patent: Aug. 4, 2015

(54) STACKED ASSEMBLY OF A MEMS INTEGRATED DEVICE HAVING A REDUCED THICKNESS

(71) Applicant: STMicroelectronics S.r.l., Agrate Brianza (IT)

(72) Inventor: Federico Giovanni Ziglioli, Pozzo d'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/922,577

(22) Filed: Jun. 20, 2013

(65) Prior Publication Data

US 2014/0231979 A1     Aug. 21, 2014

(30) Foreign Application Priority Data

Jul. 13, 2012   (IT) .............................. TO2012A0623

(51) Int. Cl.
*H01L 23/02* (2006.01)
*B81B 7/00* (2006.01)
*B81C 1/00* (2006.01)

(52) U.S. Cl.
CPC ................ *B81B 7/007* (2013.01); *B81B 7/008* (2013.01); *B81C 1/0023* (2013.01); *B81C 1/00301* (2013.01)

(58) Field of Classification Search
USPC ........................ 257/686, 777, 723, 724, 432
See application file for complete search history.

(56) References Cited

U.S. PATENT DOCUMENTS

| | | | |
|---|---|---|---|
| 7,736,946 B2 * | 6/2010 | Seppala et al. ................ 438/106 |
| 7,872,356 B2 * | 1/2011 | Sanchez et al. ............... 257/777 |
| 8,174,105 B2 * | 5/2012 | Kwang et al. ................. 257/685 |
| 2008/0283993 A1 * | 11/2008 | Sanchez et al. .............. 257/686 |
| 2009/0194829 A1 | 8/2009 | Chung et al. |
| 2012/0101540 A1 | 4/2012 | O'Brien et al. |
| 2013/0032936 A1 * | 2/2013 | Formosa ....................... 257/704 |
| 2013/0334627 A1 * | 12/2013 | Conti et al. ................... 257/416 |
| 2014/0319630 A1 * | 10/2014 | Conti et al. ................... 257/416 |

FOREIGN PATENT DOCUMENTS

EP        1602896 A2     12/2005

* cited by examiner

*Primary Examiner* — S. V. Clark
(74) *Attorney, Agent, or Firm* — Seed IP Law Group PLLC

(57) ABSTRACT

An assembly of a MEMS integrated device envisages: a package having a base substrate with a main surface in a horizontal plane, and a coating set on the base substrate; a first body including semiconductor material and integrating a micromechanical structure, housed within the package on the base substrate; at least one second body including semiconductor material and integrating at least one electronic component, designed to be functionally coupled to the micromechanical structure, the first body and the second body being arranged within the package stacked in a vertical direction transverse to the horizontal plane. In particular, at least one between the first body and the base substrate defines a first recess, in which the second body is housed, at least in part.

20 Claims, 8 Drawing Sheets

STACKED ASSEMBLY OF A MEMS INTEGRATED DEVICE HAVING A REDUCED THICKNESS

BACKGROUND

1. Technical Field

The present disclosure relates to a stacked assembly of an integrated device of a microelectromechanical type, referred to in what follows as MEMS (Micro-ElectroMechanical System).

2. Description of the Related Art

In the field of integrated devices there is a desire for size reduction in order to meet the increasingly stringent requisites of miniaturization, in particular in the field of portable apparatuses.

As it is known, a MEMS integrated device in general comprises: a first body (usually defined as "die") including semiconductor material (for example, silicon), integrating a micromechanical structure, operating for example, as a sensor for one or more quantities to be detected (for example, for providing an accelerometer, a gyroscope, a magnetometer, etc.) and generating an electrical quantity that is a function of the quantity to be detected (for example, a capacitive variation, a variation of electrical resistance, etc.); and at least one second die including semiconductor material (for example, silicon), integrating at least one electronic component or circuit, designed to be electrically coupled to the micromechanical structure so as to co-operate functionally therewith. Typically, the second die integrates an ASIC (Application-Specific Integrated Circuit), electrically coupled to the micromechanical structure, having, for example, the function of reading the electrical quantity detected by the micromechanical structure, where the structure operates as a sensor (for example, for carrying out operations of amplification and filtering of the detected electrical quantity).

A covering structure, or cap, is moreover provided in the MEMS integrated device, mechanically coupled on top of the first die integrating the micromechanical structure, with functions of protection for the same micromechanical structure. When the micromechanical structure have moving elements, for example, a beam or a membrane, designed to undergo deformation as a function of the quantity to be detected, the covering structure may have at least one cavity, provided above the moving elements, so as to define an empty space that ensures the freedom of movement and does not alter deformation thereof. Moreover, an access duct may possibly be formed through the covering structure, where a fluid connection with the outside (for example, for entry of pressure waves or acoustic waves) is utilized.

A MEMS integrated device generally also includes a package, i.e., a container or housing that surrounds, totally or in part, the dice of the device, enabling electrical connection thereof from the outside. The assembly of the MEMS integrated device, within the corresponding package, is usually defined as "chip" and may, for example, be electrically connected to a printed circuit board of an electronic apparatus in which the MEMS integrated device is to be used.

For example, a known package structure, defined as "wafer-level package" or "substrate-level package", envisages the presence of a base substrate, to which the dice of the MEMS integrated device are coupled and which carries appropriate electrical contacts for electrical connection to the outside world, and of a protection coating, so-called "mold compound" formed directly on top of the base substrate and the dice, having coating and mechanical protection functions.

Traditionally, the dice of the MEMS integrated devices, integrating the respective micromechanical structure and ASIC, were set alongside one another on the inner surface of the base substrate of the package (i.e., the surface not facing the outside of the same package).

In order to reduce the lateral dimensions (i.e., the dimensions in a horizontal plane, parallel to the main plane of extension of the base substrate), stacking in the vertical direction (i.e., orthogonal to the horizontal plane) has been proposed for the first die integrating the micromechanical structure (with associated covering structure) and the second die integrating the ASIC.

This solution, although enabling the desired reduction of the lateral encumbrance, involves an increase in the overall thickness in the vertical direction that may be incompatible with some applications, in particular with applications of a portable type.

In fact, considering a typical thickness comprised between 400 μm and 420 μm for coupling between the first die integrating the micromechanical structure and the corresponding covering structure, and comprised between 80 μm and 280 μm for the thickness of the second die integrating the ASIC, and moreover considering the additional thickness represented by the package, with current techniques it is possible to obtain a minimum value of resulting thickness that is still rather high, ranging between 700 μm and 1000 μm.

To overcome at least in part this problem it has therefore been proposed to exploit the covering structure as active element in which to integrate the electrical/electronic components to be electrically coupled to the micromechanical structure in the first die (the second die being in this case absent in the assembly of the MEMS integrated device). This solution, although enabling a reduction of thickness equal to the thickness of the second die integrating the ASIC, is not, however, free from drawbacks.

In particular, the active use of the covering structure may prove to be difficult to implement, on account of the poor yield of the process of integration and of the imposed constraints as regards the usable dimensions.

BRIEF SUMMARY

One or more embodiments are directed to assemblies of MEMS integrated devices that reduce the occupation of space in the vertical thickness direction.

According to one embodiment of the present disclosure, a stacked assembly of a MEMS integrated device is provided. The stacked assembly may include structure that includes a recess in which a body of semiconductor material is at least in part housed.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

As will be clarified in detail hereinafter, an aspect of the present disclosure envisages that, in the stacked assembly of a MEMS integrated device, and in particular in the coupling between the first die integrating the micromechanical structure (see the foregoing discussion) and the corresponding covering structure with the base substrate of the package, a recess, cavity, or undercut is defined, designed to house in the thickness direction the second die integrating the electrical/electronic component or components that it is desired to couple to the same micromechanical structure. In particular, the recess is defined by the shaping of at least one between the aforesaid coupling between the first die and the corresponding covering structure, and the base substrate of the package.

In this way, as will in any case be clear from the following discussion, it is possible to obtain a thickness reduction for the MEMS integrated device, which may even be equal to approximately the thickness of the second die.

Figure 1A:
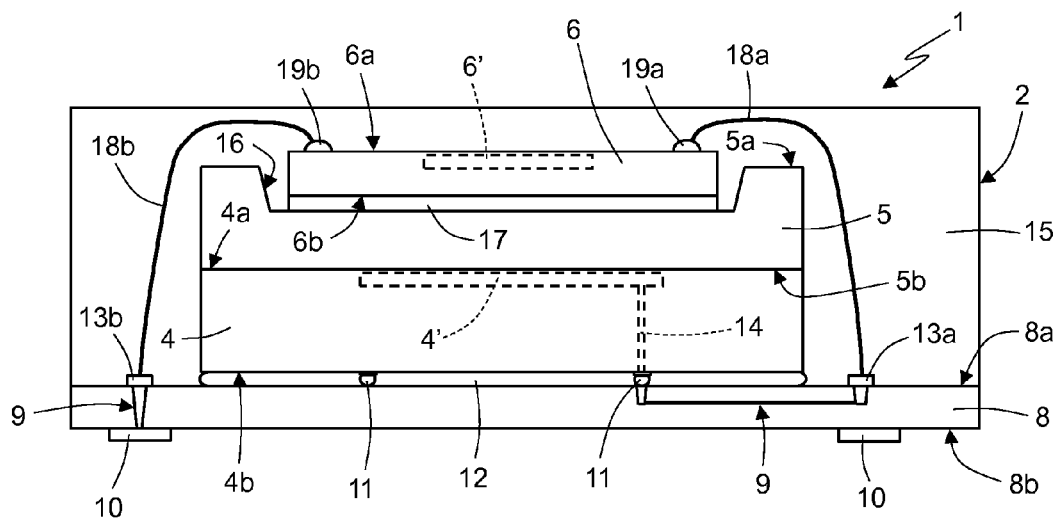
FIGS. 1a-1c show respective cross-sectional views of variants of assembly of a MEMS integrated device according to a first embodiment of the present disclosure.

In detail, and with reference first to FIG. 1a, a MEMS integrated device, designated as a whole by 1, comprises a package 2, enclosed inside which are: a first die 4, including a structural layer of semiconductor material and, in a known way, further layers of insulating and/or conductive materials on the structural layer, the first die integrating a micromechanical structure (for example, an acceleration-sensing structure, a gyroscope, a magnetometer, etc.), illustrated schematically and designated by 4'; a covering structure 5, coupled to the first die 4, in order to protect the micromechanical structure (possible cavities in the covering structure that may for example allow for movement of the micromechanical structure, as it is known, are not illustrated in the simplified view of FIG. 1a); and a second die 6, including a respective structural layer of semiconductor material (and possible layers of insulating and/or conductive material), integrating an ASIC, illustrated schematically and designated by 6', designed to be electrically coupled to the micromechanical structure 4' in the first die 4 (and including, in a known way, a plurality of active and/or passive electronic components, such as transistors, capacitors, inductors, resistances, amplifiers, etc.).

The first die 4 has a thickness in a vertical direction z comprised, for example, between 150 and 300 μm, and the covering structure 5 has a thickness in the same vertical direction z, also comprised, for example, between 150 and 300 μm. Furthermore, the first and second dice 4, 6 are vertically stacked within the package 2 (i.e., in the vertical direction z, orthogonal to a horizontal plane xy of main extension).

The package 2 includes a base substrate 8, for example, constituted by a multilayer structure, made up of one or more layers of conductive material (generally metal) separated by one or more dielectric layers, for example, constituted by a BT (bismaleimide triazine) laminate. Electrical paths, designated as a whole by 9, are envisaged through the base substrate 8, for example, in the form of through vias and metal paths at a number of depth levels, to connect an inner surface 8a thereof, facing the space inside the package 2, to an outer surface 8b thereof, facing the environment external to the package 2, which carries appropriate electrical-connection elements, designated as a whole by 10, for example, in the form of an array of balls or bumps, in the case of so-called BGA (ball-grid array) packages, or lands, in the case of so-called LGA (land-grid array) packages, as is the case illustrated in FIG. 1a.

The base substrate 8 has an extension in the horizontal plane xy greater than the corresponding horizontal extension of the first die 4.

The first die 4 has a top surface 4a, at which the micromechanical structure 4' is provided, with known micromachining techniques, and a bottom surface 4b coupled to the inner surface 8a of the base substrate 8, for example, by means of the bump-bonding technique, i.e., by means of bumps 11, at least in part of conductive material; moreover, an underfill region 12 is set between the inner surface 8a of the base substrate 8 and the bottom surface 4b of the first die 4.

Electrical connections between the micromechanical structure 4' and first substrate contact pads 13a carried by the inner surface 8a of the base substrate 8, in part externally with respect to the underfill region 12, are made by means of through vias 14, which traverse the thickness of the first die 4 and are connected to the bumps 11, and the electrical paths 9 buried in the base substrate 8.

The package 2 further comprises a coating 15, the so-called "mold compound", for example, made of resin and obtained via molding techniques, which surrounds the stacked assembly of the first die 4 (with corresponding covering structure 5) and of the second die 6, and coats at the top external portions of the base substrate 8, not covered by the first die 4.

In particular, the covering structure 5 has a top surface 5a and a bottom surface 5b, which is coupled to the first die 4 on the top surface 4a, for example, by means of a bonding ring (not illustrated herein), such as to form an empty space or gap (not illustrated either) between the facing surfaces (for example, to enable deformation of a membrane, or similar moving element, of the micromechanical structure 4', as a function of a quantity to be detected).

According to an aspect of the present embodiment, a recess 16 is defined at the top surface 5a of the covering structure 5, obtained for example, by means of a timed chemical etch starting from the top surface 5a (for example, executed at the end of the steps of the so-called "front-end" process for formation of the micromechanical structure 4') designed to remove a surface portion of the covering structure 5, leaving an empty, removed or taken away, area. The recess 16 has, for example, a depth in the vertical direction z comprised between 80 μm and 100 μm, and an extension in the horizontal plane xy smaller than a corresponding horizontal extension of the covering structure 5.

The covering structure 5 has externally projecting portions defining side walls of the recess 16, and centrally a recessed portion defining a base of the recess 16; the aforesaid base extends in the horizontal plane xy, and the aforesaid side walls extend substantially vertically starting from said base. In other words, the portions of the top surface 5a at the side walls of the recess 16 lie on, or define, a surface substantially parallel to the horizontal plane xy, which delimits the covering structure 5, and the recess 16 extends starting from this surface towards the inside of the covering structure 5, with the side walls extending transverse to the same surface.

The second die 6 is housed in the recess 16, and has a top surface 6a, at which the ASIC 6' is provided, and a bottom surface 6b mechanically coupled to the top surface 5a of the covering structure 5, at the base of the recess 16, by means of the interposition of an adhesive material region 17. In particular, the thickness of the second die 6 in the vertical direction z is substantially contained within the recess 16.

For this purpose, conveniently, the second die 6 is subjected to a so-called "backgrinding" operation, of a known type, for thinning-out of its thickness, prior to its coupling within the recess 16.

Thanks to the presence of the recess 16 housing the second die 6, the resulting thickness of the vertical stacking between the first die 4 (and the corresponding covering structure 5) and the second die 6 substantially coincides with the thickness of the assembly between the same first die 4 and covering structure 5. For example, the resulting thickness is comprised between 400 µm and 420 µm.

The electrical connections between the ASIC 6' in the second die 6 and the micromechanical structure 4' in the first die 4, and moreover between the ASIC 6' and the electrical-connection elements 10 on the outside of the package 2 are obtained with the wire-bonding technique, i.e., using electrical wires.

In detail, first electrical wires 18a connect first ASIC contact pads 19a, carried by the top surface 6a of the second die 6, to the first substrate contact pads 13a in such a way as to provide the electrical connection between the ASIC 6' and the micromechanical structure 4'. Moreover, second electrical wires 18b connect second ASIC contact pads 19b, carried by the top surface 6a of the second die 6, to second substrate contact pads 13b, carried by the inner surface 8a of the substrate, externally with respect to the area occupied by the first die 4 in such a way as to provide the electrical connection between the ASIC 6' and the electrical-connection elements 10 on the outside of the package 2, through the electrical paths 9 formed through the base substrate 8.

The coating 15 of the package 2 in this case coats the second die 6 at the top, the corresponding contact pads 19a, 19b, and the electrical wires 18a, 18b, moreover defining a top outer surface of the package 2 (opposite to the bottom outer surface that carries the electrical-connection elements 10). The coating 15 coats the contact pads 13a, 13b, carried by the base substrate 8, and the external portions of the same base substrate 8, not covered by the first die 4, moreover defining lateral outer surfaces of the package 2.

In a variant embodiment (illustrated in FIG. 1b), the second die 6 is housed in the recess 16 defined by the top surface 5a of the covering structure 5 turned upside down, with the so-called "flip-chip" technique, i.e., with the top surface 6a facing the top surface 5a of the covering structure 5, at the base of the recess 16, and coupled to the same base by means of coupling elements 21, in the form of solder balls, at least in part made of conductive material.

The electrical connections between the ASIC 6', the micromechanical structure 4', and the electrical-connection elements 10 on the outside of the package 2 are obtained in this case by means of electrical tracks, such as those deposited, conveniently by means of the aerosol-jetting technique, in particular on the vertical surface, or by front-end sputtering/photolithography on the top surface 5a of the covering structure 5. In particular, first conductive tracks 22a (one of which is illustrated in the figure, by way of example) are formed between first conductive elements 21a, connected to the first ASIC contact pads 19a carried by the top surface 6a of the second die 6, and the first substrate contact pads 13a, in such a way as to provide the electrical connection between the ASIC 6' and the micromechanical structure 4'. Moreover, second conductive tracks 22b (one of which is illustrated in the figure, by way of example) are formed between second conductive elements 21b, connected to the second ASIC contact pads 19b, carried by the top surface 6a of the second die 6, and the second substrate contact pads 13b, carried by the inner surface 8a of the base substrate 8, in such a way as to provide the electrical connection between the ASIC 6' and the electrical-connection elements 10 on the outside of the package 2.

The conductive tracks 22a, 22b extend on the top surface 5a of the covering structure 5, starting from the base of the recess 16, and proceed in contact with the side walls of the assembly of the covering structure 5 and of the first die 4, until the inner surface 8a of the base structure 8 is reached.

The coating 15 of the package 2 coats the rear surface 6b of the second die 6 and moreover coats the conductive tracks 22a, 22b entirely.

Figure 1B:
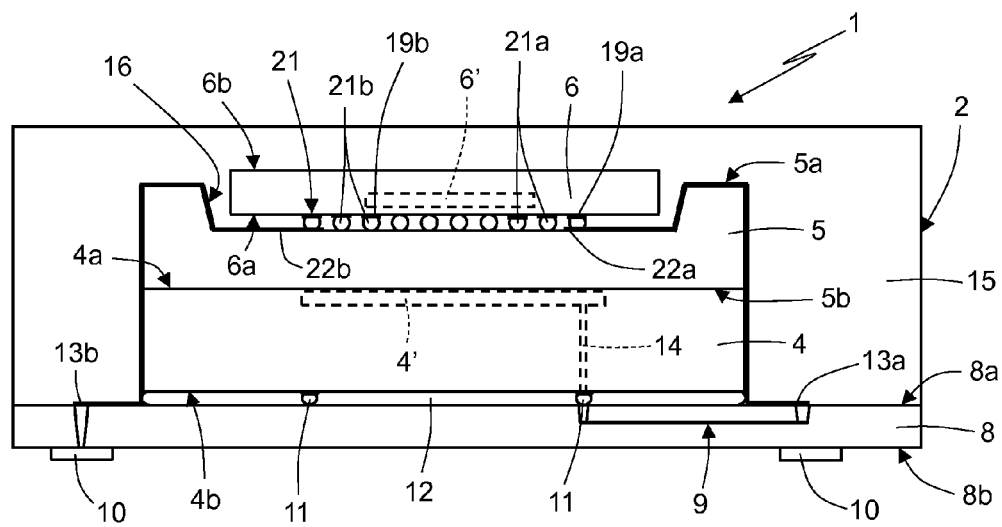
Figure 1C:
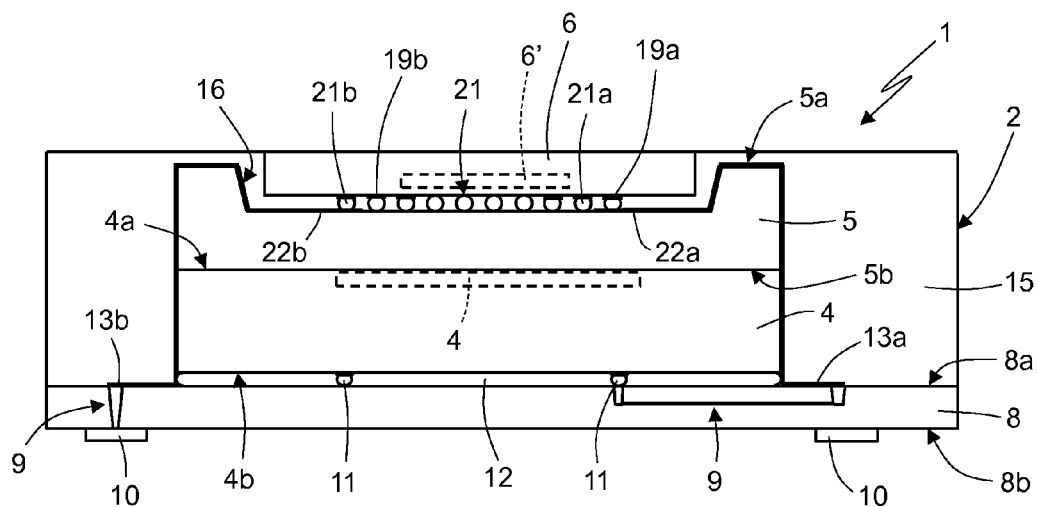

A further variant embodiment (illustrated in FIG. 1c), differs from what has been illustrated with reference to FIG. 1b in that the bottom surface 6b of the second die 6 is left exposed by the coating 15 of the package 2, hence defining part of the top outer surface of the package 2. This solution evidently enables a further reduction of the resulting thickness of the MEMS integrated device 1.

Figure 2A:
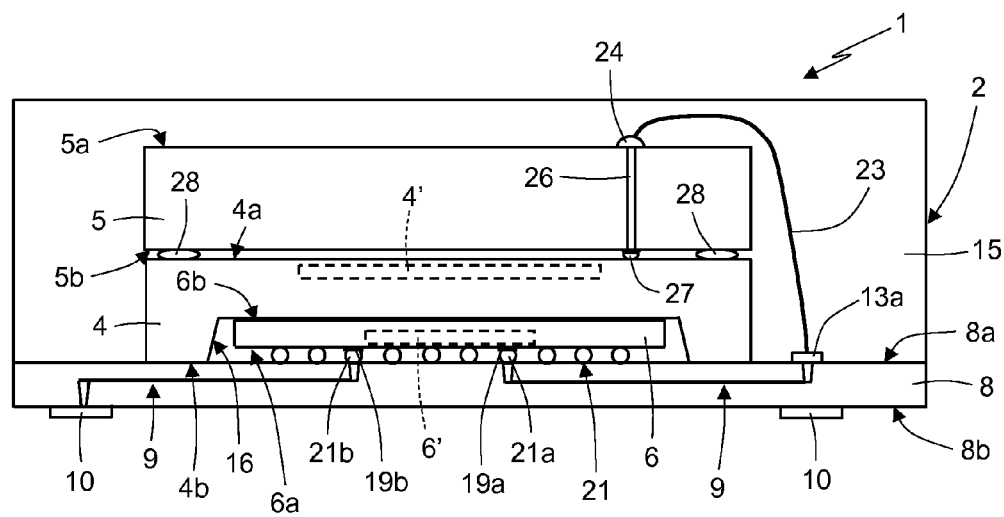
FIGS. 2a-2f show respective cross-sectional views of variants of assembly according to a second embodiment of the present disclosure.

A second embodiment of the present disclosure (a first variant of which is illustrated in FIG. 2a) envisages that the recess, once again designated by 16, designed to house the second die 6 integrating the ASIC 6', is defined (in a way substantially similar to what has been discussed previously) by the bottom surface 4b delimiting the first die 4 at the bottom, being hence constituted by an empty space set between the inner surface 8a of the base substrate 8 and the bottom surface 4b of the first die 4.

In this case, the first die 4 laterally has supporting portions attached to the base substrate 8 and defining side walls of the recess 16, and at the center a portion suspended over the recess 16 and defining at the bottom the base of the recess 16.

In the embodiment illustrated in FIG. 2a, the second die 6 is set upside down within the recess 16, and is connected to the inner surface 8a of the base substrate 8 by means of the coupling elements 21 using the bump-bonding technique. First electrical paths 9, buried in the base substrate 8, electrically connect the first conductive elements 21a, connected to the first ASIC contact pads 19a carried by the top surface 6a of the second die 6, to the first substrate contact pads 13a, whilst second electrical paths 9 electrically connect the second conductive elements 21b, connected to the second ASIC contact pads 19b, carried by the top surface 6a of the second die 6 to the electrical-connection elements 10 on the outside of the package 2.

The electrical connection between the micromechanical structure 4' and the ASIC 6' is provided by means of electrical wires 23, which extend between the first substrate contact pads 13a and cap contact pads 24, carried by the top surface 5a of the covering structure 5 (which, in this case, is plane and uniform in the horizontal plane xy, i.e., without undercuts), and electrically connected to the micromechanical structure 4' by means of through vias 26, extending through the covering structure 5.

The through vias 26 are connected to conductive elements (or bumps) 27, arranged inside the bonding ring, here designated by 28, defining the coupling between the covering structure 5 and the first die 4. The conductive elements 27 are in turn electrically connected, in a way not illustrated, to appropriate elements of the micromechanical structure 4'.

The coating 15 of the package 2 in this case coats entirely the assembly of the covering structure 5 and of the first die 4, and moreover the electrical wires 23.

Figure 2B:
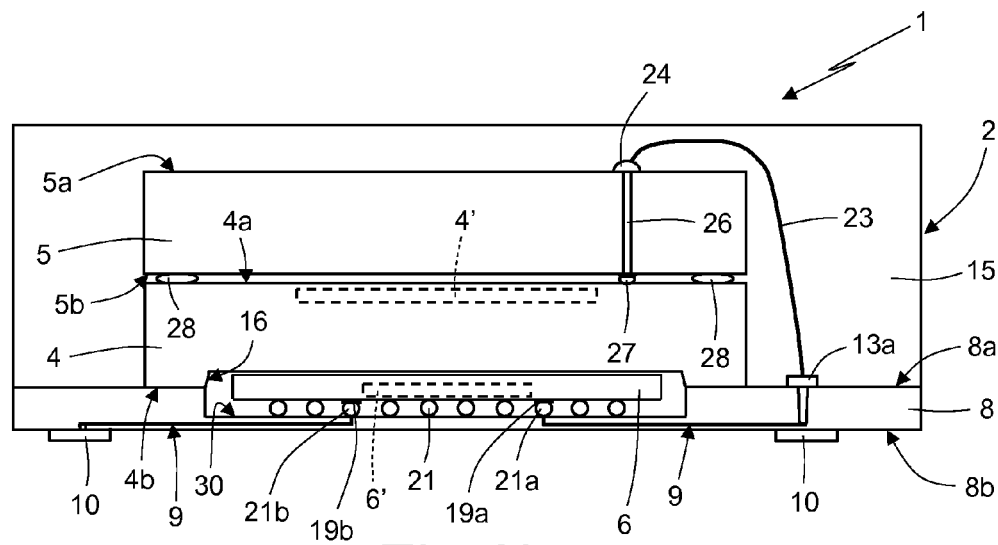

In a variant embodiment (illustrated in FIG. 2b), a further recess, designated by 30, is defined by the inner surface 8a of the base substrate 8, in a position corresponding to, and facing, the recess 16 defined by the bottom surface 4b of the first die 4. The recesses 16, 30 jointly define a space in which the second die 6 is housed. The recess 30 is provided by chemical etching of the base substrate 8, starting from the front, which leads to removal of a surface portion thereof, starting from the inner surface 8a.

This variant is advantageous in the case where the thickness of the second die 6 is greater than the depth of just the recess 16 and hence prefers a larger space for housing it.

In a further variant embodiment (illustrated in FIG. 2c), the recess 16, defined also in this case by the bottom surface 4b of the first die 4, is open laterally, i.e., it extends as far as a side wall of the first die 4 so as to be flush with the same side wall.

The second die 6 is in this case housed in part in the recess 16, exiting laterally from the same recess 16, at the aforesaid side wall of the first die 4. The second die 6 is in this case set with the bottom surface 6b coupled to the inner surface 8a of the base substrate 8 by means of the adhesive layer 17. A side portion of the top surface 6a, which is not covered by the first die 4, carries contact pads, here designated as a whole by 33, which, through electrical wires 34, are electrically connected to the base substrate 8 and then, through the electrical paths 9, to the electrical-connection elements 10 on the outside of the package 2 and/or to the first substrate contact pads 13a for electrical connection to the micromechanical structure 4'.

Figure 2C:
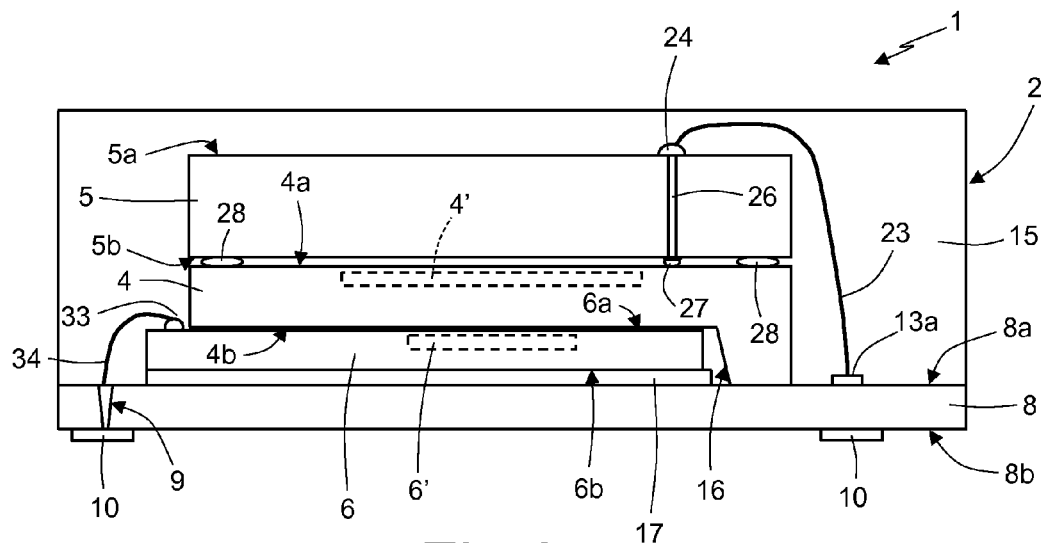

A variant embodiment (illustrated in FIG. 2d), differs from what is illustrated in FIG. 2c owing to the presence of the further recess 30 defined by the inner surface 8a of the base substrate 8, housing, jointly with the recess 16 defined by the bottom surface 4b of the first die 4, the second die 6.

Figure 2D:
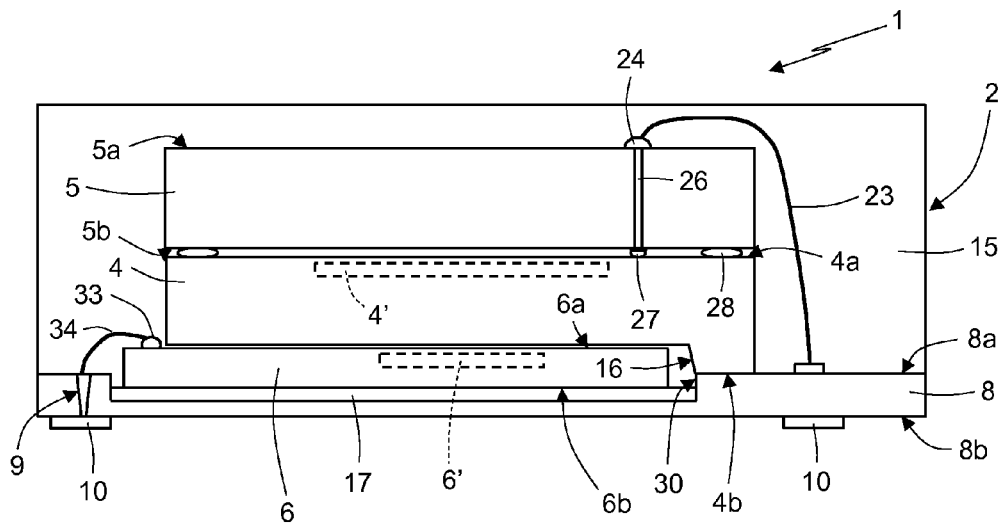

A further variant embodiment (illustrated in FIG. 2e), differs from what is illustrated in FIG. 2d in so far as the covering structure 5 does not coat the first die 4 entirely, leaving a side portion of its top surface 4a exposed. Electrical-connection pads, here designated by 36, are connected to electrical wires 23 and set on the exposed portion of the top surface 4a to enable electrical connection of the micromechanical structure 4' (through buried paths 37, made in a surface portion of the first die 4, also arranged underneath the bonding ring 28). In this variant embodiment, the top surface 5a of the covering structure 5 is not covered by the coating 15 and hence defines part of the top outer surface of the package 2.

Figure 2E:
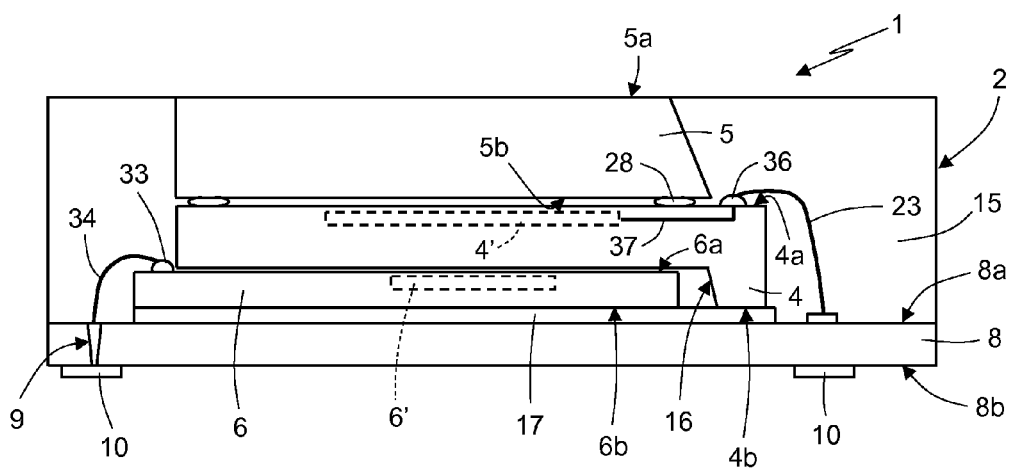
Figure 2F:
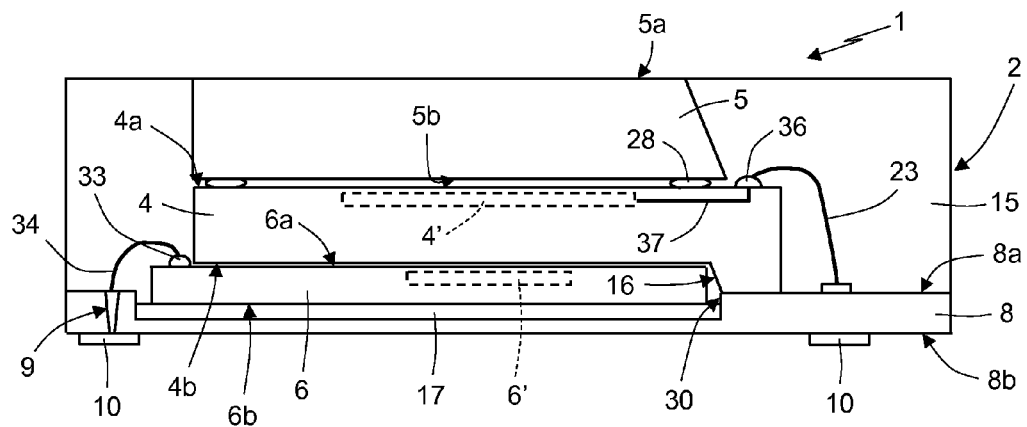

The variant embodiment of FIG. 2f differs from what is illustrated in FIG. 2e only for the presence of the further recess 30, designed to house in part the second die 6, in a way similar to what has already been illustrated previously.

One or more advantages of the assembly proposed for a MEMS integrated device emerge from the foregoing description.

In particular, it is once again emphasized that the assembly described enables reduction of the overall thickness of the package in the vertical stacking of the dice, or bodies of semiconductor material, integrating the micromechanical structure and the associated electronic components and/or circuits.

It is hence possible to reduce the occupation of space, at the same time providing a complete system, having multiple functions, within a single package (SiP or System-in-Package).

The size reduction being obtained makes the described assembly particularly suitable for portable applications.

Figure 3:
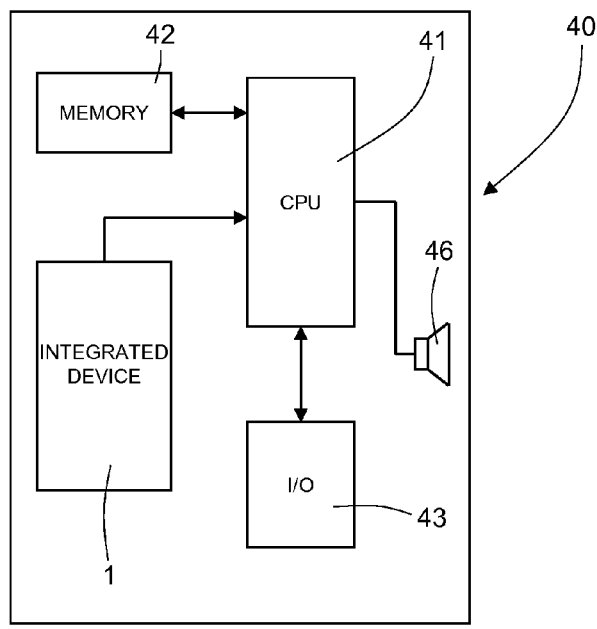
FIG. 3 shows a block diagram of an electronic device including the assembly of the MEMS integrated device.

In this regard, FIG. 3 shows an electronic apparatus 40 using the MEMS integrated device 1, made as previously illustrated so as to provide a SIP; the portable apparatus 40 is preferably a mobile communication device, such as for example, a cell phone, a PDA (Personal Digital Assistant), a notebook, but also a voice recorder, a recorder of audio files with capacity for voice recording, a console for video games, a photographic camera or video camera, being generally able to process, store, transmit, and receive signals and information.

The electronic apparatus 40 comprises, in addition to the MEMS integrated device 1, a microprocessor (CPU) 41, a memory block 42, connected to the microprocessor 41, and an input/output interface 43, for example, a keypad and/or a display, which is also connected to the microprocessor 41.

The MEMS integrated device 1 communicates with the microprocessor 41, and in particular transmits the electrical signals processed by the ASIC 6' associated to the micromechanical structure 4'.

Furthermore, a loudspeaker 46 may be present to generate sounds on an audio output (not illustrated) of the electronic apparatus 40, possibly based on the electrical signals coming from the MEMS integrated device 1 (for example, in the case where the MEMS integrated device 1 is a microphone).

As illustrated schematically, the electronic apparatus 40 has a printed circuit board (PCB) 40', to which the elements of the electronic apparatus 40, in particular the MEMS integrated device 1, are electrically coupled by way of the electrical-connection elements 10.

Finally, it is clear that modifications and variations may be made to what has been described and illustrated herein, without thereby departing from the scope of the present disclosure.

In particular, the described solution may advantageously be applied when the die integrating the micromechanical structure (with the possible associated covering structure) and one or more integrated electronic components, for example, capacitors, inductors, etc., for proper operation of said micromechanical structure, are to be housed within one and the same package.

It is known in fact that MEMS integrated sensors frequently utilize for their operation passive elementary components, such as capacitors or inductors, for example, for reasons of calibration, noise filtering, etc. In traditional solutions, these passive components are set in the package alongside the die of the micromechanical structure on the base substrate.

The solution described enables, by means of appropriate stacking in the vertical direction z, reduction of the occupation of space, both in the horizontal plane xy and in the vertical direction z.

Figure 4A:
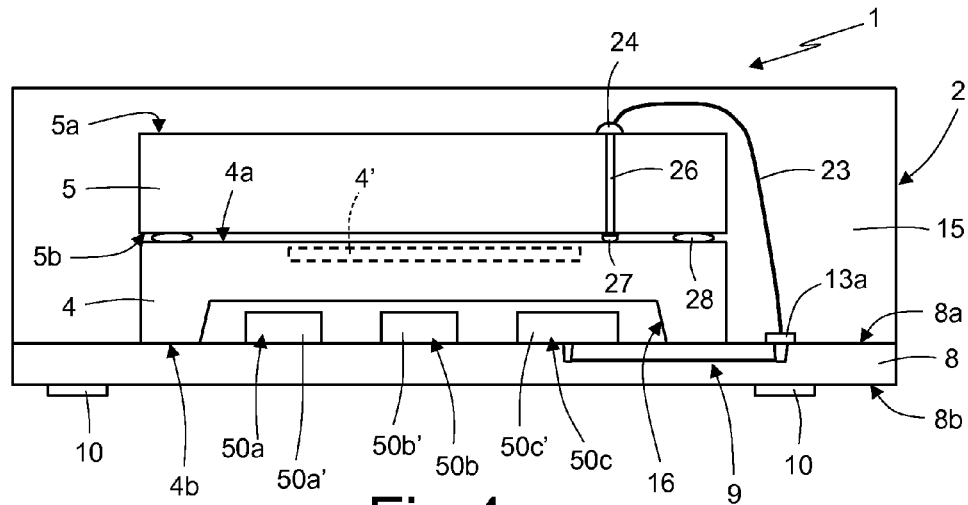
FIGS. 4a-4d show respective cross-sectional views of variants of assembly according to a further embodiment of the present disclosure.

In detail, and with reference first to FIG. 4a, one or more electronic components (for example, inductors or capacitors), each integrated in a respective body of semiconductor material, may be housed in the recess 16 set between the inner surface 8a of the base substrate 8 and the bottom surface 4b of the first die 4 integrating the micromechanical structure 4'. For example, two distinct bodies made of semiconductor material 50a, 50b, integrating a respective integrated capacitor, designated by 50a', 50b' and also a further body of semiconductor material 50c, integrating an integrated inductor, designated by 50c', may be housed in the recess 16, each mechanically and electrically coupled to the inner surface 8a of the base substrate 8 (in a known way, not illustrated herein). The electrical connections between the micromechanical structure 4' and the integrated electronic components 50a'-50c' may be provided in a way similar to what has been described previously, in particular by means of buried electrical paths 9, provided through a surface portion of the base substrate 8.

Figure 4B:
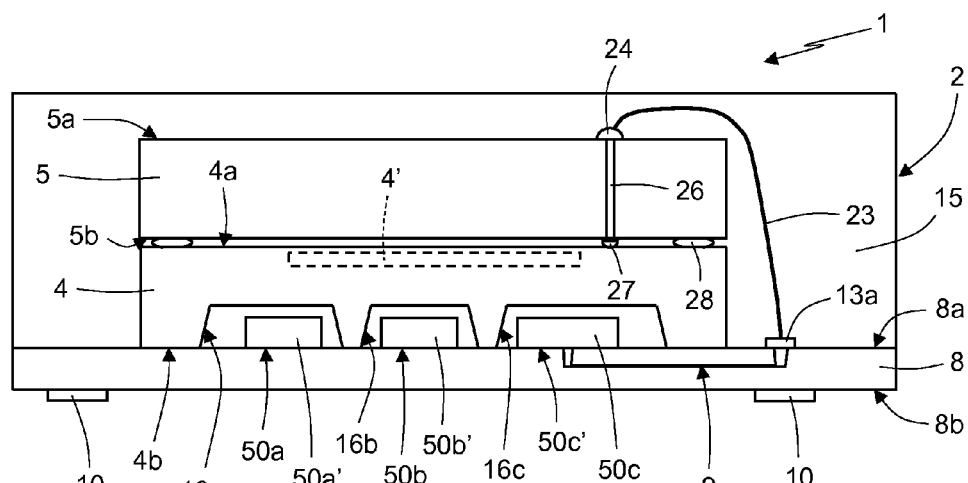

In the variant embodiment illustrated in FIG. 4b, the recess 16 defined by the bottom surface 4a of the first die 4 comprises a plurality of recess portions, designated by 16a-16c, separated from one another by walls constituted by projections of the first die 4 extending towards, and mechanically coupled to, the base substrate 8 (made through chemical etching from the back of the first die 4). Each integrated electronic component 50a'-50c' is in this case housed by, and contained in, a respective recess portion 16a-16c.

Figure 4C:
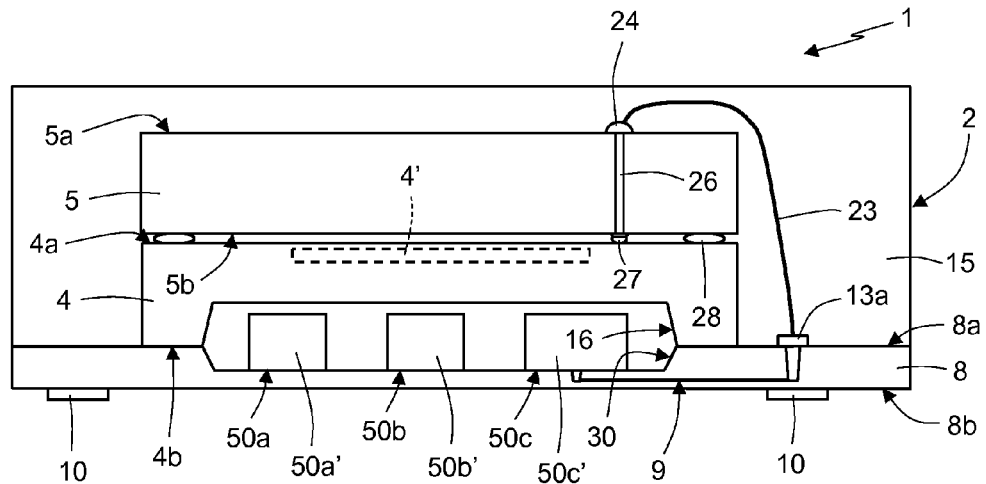

In the variant embodiment of FIG. 4c, the further recess 30 defined by the inner surface 8a of the base substrate 8 is instead present, which forms, together with the recess 16, the space for housing the integrated electronic components 50a'-50c' (which may in this case have a larger thickness).

Figure 4D:
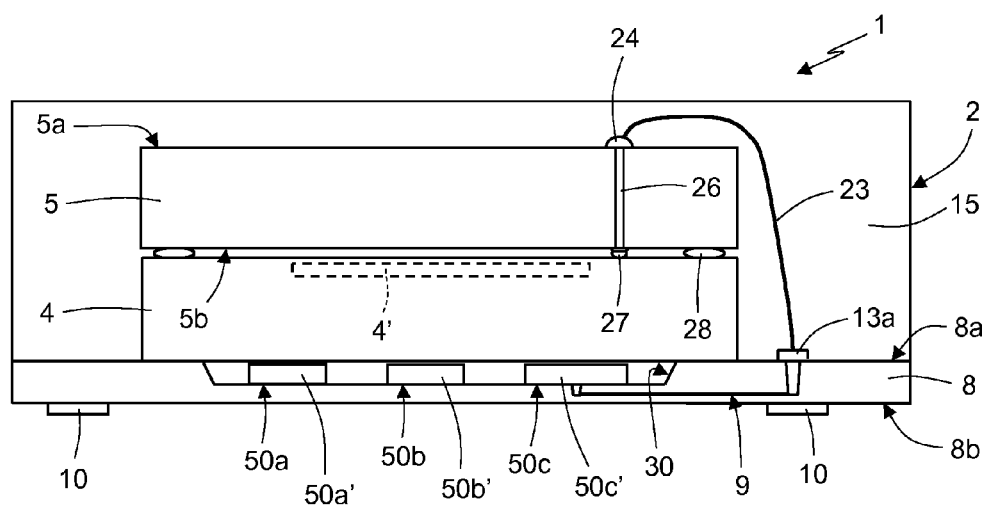

Yet a further variant embodiment (illustrated in FIG. 4d), envisages the presence only of the further recess 30 defined by the inner surface 8a of the base substrate 8, whereas in this case the recess 16 is not provided in the first die 4 (in other words, the bottom surface 4a of the first die 4 is in this case plane and uniform in the horizontal plane xy).

The further recess 30 has in this case sufficient depth, in the vertical direction z, to accommodate the thickness of the integrated electronic components 50a'-50c'.

Figure 5:
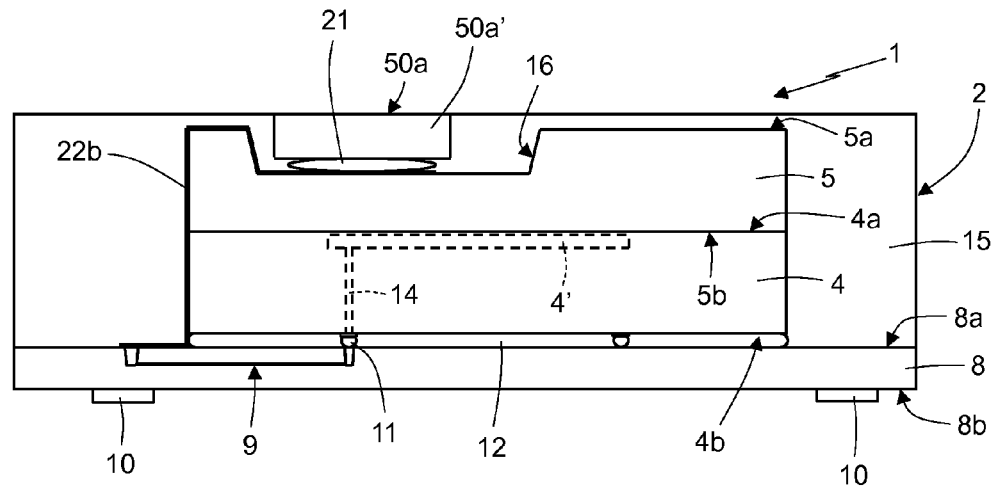
FIGS. 5-6 show respective cross-sectional views of further variants of assembly according to yet another aspect of the present disclosure.

As illustrated in FIG. 5, also in the case where the recess 16 is defined by the top surface 5a of the covering structure 5 (in a way substantially similar to what has previously been illustrated), at least one integrated electrical component, designated by 50a', may be housed in said recess 16, with a bottom surface of the corresponding body of semiconductor material 50a mechanically coupled to the aforesaid top surface 5a of the covering structure 5, at the base of the recess 16, in this case by means of at least one conductive element 21 (which is, in turn, connected to a conductive track 22b). In the assembly of FIG. 5, an outer surface of the body of semiconductor material 50a integrating the integrated electronic component 50a', is exposed and accessible from outside, defining part of the top outer surface of the package 2 of the MEMS integrated device 1.

It is in general emphasized that what has been described previously applies to any structure integrated in the first die 4 (for example, to any MEMS sensing structure). Moreover, the solution described may find advantageous application also in the case where the MEMS integrated device 1 includes a greater number of dice or bodies of semiconductor material, to provide stacking thereof in the vertical direction, with reduced space occupation.

Figure 6:
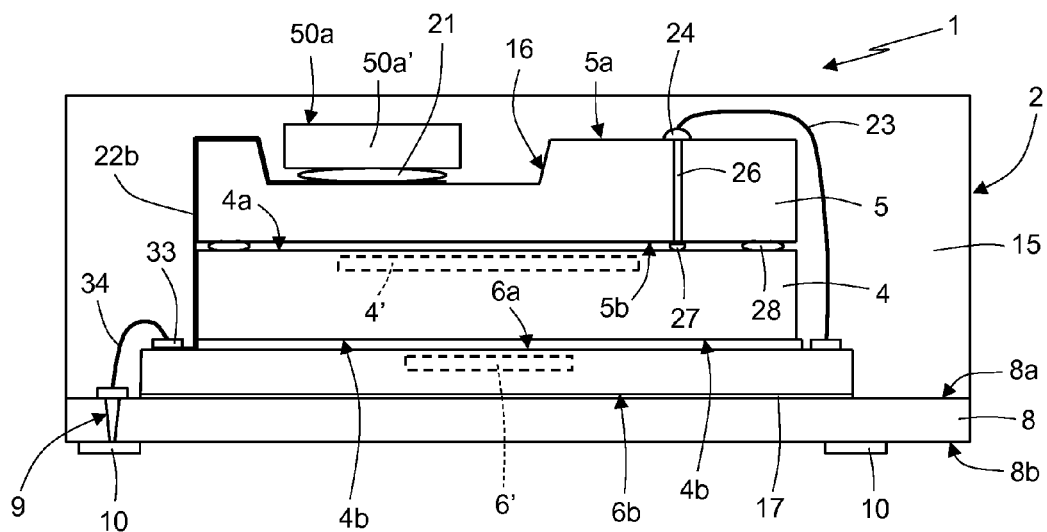

For example, in a further embodiment (illustrated in FIG. 6), the MEMS integrated device 1 comprises, vertically stacked, the first die 4 integrating the micromechanical structure 4', the covering structure 5, the second die 6 integrating the ASIC 6', and the body of semiconductor material 50a integrating the integrated electronic component 50a', housed in the recess 16 defined by the top surface 5 of the covering structure 5.

Evidently, a variant (not illustrated) of this embodiment may envisage one or more further recesses 30 defined by the inner surface 8a of the base substrate 8 and/or by the bottom surface 4b of the first die 4, for the further reduction of space in the vertical stacking direction z.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An assembly comprising:
    a package that includes a base substrate having a main surface and a coating located on a portion of said main surface of said base substrate;
    a first body including semiconductor material and integrating a micromechanical structure housed within said package on said main surface of said base substrate; and
    a second body including semiconductor material and integrating at least one electronic component that is functionally coupled to said micromechanical structure, said first body and said second body being arranged within said package and stacked in a vertical direction that is transverse to said main surface of the base substrate, at least one of said first body and said base substrate having a first recess in which said second body is, at least in part, housed.

2. The assembly according to claim 1, wherein said second body is housed completely within the first recess.

3. The assembly according to claim 2, wherein:
    at least one of said first body and said base substrate is bound by a respective main surface defining said first recess; and
    said first recess provides an undercut at said respective main surface.

4. The assembly according to claim 1, wherein said first body includes:
    a first die integrating said micromechanical structure at a top surface and having a bottom surface coupled to the main surface of said base substrate that is opposite to an outer surface of said base substrate; and
    a covering structure vertically stacked above said first die configured to cover said micromechanical structure, and having a bottom surface coupled to the top surface of said first die and a top surface opposite to said bottom surface.

5. The assembly according to claim 4, wherein the top surface of said covering structure defines said first recess.

6. The assembly according to claim 5, wherein:
    said second body has a top surface at which said at least one electronic component is provided, and an opposite bottom surface; and
    said top surface of said second body is coupled to a base of said recess, the assembly further including:
    conductive elements located between contact pads on said top surface of said second body and conductive tracks on the base of said recess, on said top surface of said covering structure, and on an outer surface of said first body that is transverse to said main surface of said base substrate.

7. The assembly according to claim 6, wherein the bottom surface of said second body defines an outer face of said package and faces an environment external to said package.

8. The assembly according to claim 4, wherein the bottom surface of said first body includes said first recess that is located between said first die and said base substrate.

9. The assembly according to claim 8, wherein:
    said second body has a top surface that includes said at least one electronic component, and an opposite bottom surface;
    said top surface of the second body being coupled to a base of said recess, the assembly further including:
    conductive elements electrically connecting contact pads located on said respective top surface of said second body and conductive paths in said base substrate.

10. The assembly according to claim 8, wherein:
said first recess is parallel to said main surface of the base substrate and extends as far as a lateral outer surface that forms a boundary of said first body; and
said second body extends laterally from said recess at said lateral outer surface.

11. The assembly according to claim 8, wherein the main surface of said base substrate defines a second recess, facing, and in communication with, said first recess for jointly defining a housing for said second body.

12. The assembly according to claim 4, wherein the main surface of said base substrate defines said first recess.

13. The assembly according to claim 1, wherein said second body integrates a plurality of electronic components defining an electronic circuit configured to be functionally coupled to said micromechanical structure.

14. The assembly according to claim 1, wherein said electronic component is one of an integrated capacitor and an integrated inductor.

15. The assembly according to claim 1, further comprising a plurality of third bodies each including semiconductor material and integrating at least one second electronic component, each of the second electronic components being functionally coupled to said micromechanical structure; said third bodies being housed in said first recess.

16. The assembly according to claim 15, wherein said first recess has a plurality of distinct recess portions separated from each other by walls, each recess portion configured to house a respective one of said first electronic components and second electronic components.

17. An electronic apparatus, comprising:
a base substrate having a first surface;
a first body including semiconductor material and integrating a micromechanical structure on a first surface, the first body located on the first surface of the base substrate;
a cap located over the first surface, at least one of said first body, said base substrate, and said cap having a recess;
a second body including semiconductor material and integrating at least one electronic component that is electrically coupled to said micromechanical structure, said second body being located in the recess, the second body being stacked in a direction that is transverse to the first surface of the base substrate;
a coating covering a portion of the first body, the second body, and the first surface of the base substrate; and
a printed circuit board electrically coupled to said base substrate.

18. The electronic apparatus according to claim 17, wherein the recess is located in both an upper surface of the base substrate and a bottom surface of the first body.

19. The electronic apparatus according to claim 17, wherein the recess is located in an upper surface of the cap.

20. The electronic apparatus according to claim 17, wherein the recess is bounded by on one side in the first body and the second body extends beyond the first body.

* * * * *